(12) United States Patent
Douglas

(10) Patent No.: US 7,215,193 B2
(45) Date of Patent: May 8, 2007

(54) METHOD AND APPARATUS FOR LIMITING POWER AMPLIFIER VOLTAGE EXCURSIONS

(75) Inventor: Dale Scott Douglas, Jersey City, NJ (US)

(73) Assignee: M/A-COM, Inc., Lowell, MA (US)

( * ) Notice: Subject to any disclaimer, the term of this patent is extended or adjusted under 35 U.S.C. 154(b) by 140 days.

(21) Appl. No.: 10/996,236

(22) Filed: Nov. 23, 2004

(65) Prior Publication Data

US 2006/0109054 A1    May 25, 2006

(51) Int. Cl.
*H03F 3/217* (2006.01)

(52) U.S. Cl. .................. 330/251; 330/207 A; 330/277

(58) Field of Classification Search ...................... None
See application file for complete search history.

(56) References Cited

U.S. PATENT DOCUMENTS

| | | | |
|---|---|---|---|
| 4,630,315 A | 12/1986 | Watkinson | 455/109 |
| 5,442,322 A | 8/1995 | Kornfeld et al. | 330/285 |
| 5,457,420 A * | 10/1995 | Asada | 327/328 |
| 6,043,707 A | 3/2000 | Budnik | 330/10 |
| 6,353,359 B1 | 3/2002 | Leizerovich | 330/2 |
| 6,449,465 B1 | 9/2002 | Gailus et al. | 455/126 |
| 6,636,112 B1 | 10/2003 | McCune | 330/10 |
| 6,701,134 B1 | 3/2004 | Epperson | 455/102 |
| 6,812,766 B2 * | 11/2004 | Oishi et al. | 327/309 |
| 2002/0090921 A1 | 7/2002 | Midtgaard et al. | 455/126 |
| 2003/0042965 A1 | 3/2003 | Kanno et al. | 327/333 |
| 2004/0219891 A1 | 11/2004 | Hadjichristos | 455/102 |
| 2004/0263245 A1 | 12/2004 | Winter et al. | 330/10 |
| 2005/0064830 A1 | 3/2005 | Grigore | 455/127.4 |
| 2005/0122164 A1 | 6/2005 | Brandt et al. | 330/10 |

FOREIGN PATENT DOCUMENTS

JP        06283979        7/1994

* cited by examiner

*Primary Examiner*—Khanh Van Nguyen

(57) ABSTRACT

A power amplifier circuit includes a circuit topology with first and second switching elements. The first and second switching elements have a closed state and an open state, wherein current flows between the switching elements when they are both in the closed state. The voltage across the first and second switching elements is regulated by a clamping element that sets the connection between the first and second switching elements to a reference voltage when the switching elements are in the off position. The power amplifier may be a switching power amplifier, and the first and second switching elements may be transistors.

18 Claims, 3 Drawing Sheets

METHOD AND APPARATUS FOR LIMITING POWER AMPLIFIER VOLTAGE EXCURSIONS

FIELD OF THE INVENTION

The invention relates generally to electromagnetic processing, and more particularly to the amplification of electromagnetic waves.

BACKGROUND OF THE INVENTION

The controlled amplification of electromagnetic waves has many uses. For example, intelligence may be conveyed along a wave by amplifying electromagnetic wave characteristics so that the amplified wave can be perceived after transmission through a medium at a distance. Power amplifiers are commonly used in the communication field to increase the power of a modulated RF (radio frequency) signal which is then delivered to an antenna for transmission through the atmosphere. Two types of power amplifiers are current-source power amplifiers, in which a transistor acts as a current source, and switch-mode power amplifiers in which a transistor acts as a switch.

The output power of a switch-mode power amplifier is proportional to the resistance of the switch, however the switch may be implemented. One example is a metal oxide semiconductor (MOS) transistor acting in triode as a switched resistor. In many applications, especially cellular communication systems, it is important to precisely control the output power of the power amplifier. In order to accomplish this, the resistance of a switching transistor may be regulated by varying the gate-source voltage across the transistor (i.e., to start or stop current flow). However, a typical switching transistor is "inductively loaded," which means that it receives a supply voltage via an RF choke inductor. This arrangement leads to particularly large voltage variations on the drain of the switching transistor during signal changes. For example, in an idealized Class F switch-mode power amplifier, the voltage at the drain of a switching transistor will be 2× the supply voltage switching from "closed" to "open." The instantaneous voltage variations and accompanying electric fields can be particularly large relative to the maximum allowed voltages for sub-micron CMOS transistors commonly employed, for example, as one of the final stages of a large signal switch-mode power amplifier.

At the sub-micron level in CMOS technologies, switch-mode power amplifier performance and reliability may be negatively affected by instantaneous voltage variations due to "hot electron" effects. "Hot electrons" are individual holes or electrons which are highly accelerated due to high local electric fields. When the kinetic energy of these carriers exceeds the barrier height of the silicon gate insulator of a switching transistor, they may "jump" the barrier and enter the insulator. Over time, the effects of the accumulation of carriers in the silicon gate insulator may degrade the threshold voltage, $V_T$, drain current and/or output power of the switching transistor.

What is needed is a technique for regulating the instantaneous voltage variations across a switching transistor used for power amplification.

SUMMARY OF THE INVENTION

Embodiments of the present invention include methods, apparatuses and articles of manufacture for amplifying electromagnetic waves. Preferred embodiments employ a circuit topology with first and second switching elements. The first and second switching elements are connected at a node and have an "on" or "closed" position and an "off" or an "open" position, wherein current flows between the switching elements when they are in the "closed" position and does not flow between them when they are in the "open" position. The voltage across the first and second switching elements is regulated by a clamping element that sets voltage at the node between the first and second switching elements to a reference voltage when the switching elements are in the "open" position. In preferred embodiments, the circuit is a switch-mode power amplifier, and the first and second switching elements are field effect transistors (FETs), for example an n-channel, metal oxide semiconductor FET (nMOSFET or nFET).

BRIEF DESCRIPTION OF THE DRAWINGS

A more complete appreciation of the invention and many of the attendant features and advantages thereof will be readily obtained as the same become better understood by reference to the following detailed description when considered in connection with the accompanying drawings, wherein.

DETAILED DESCRIPTION

Figure 1:
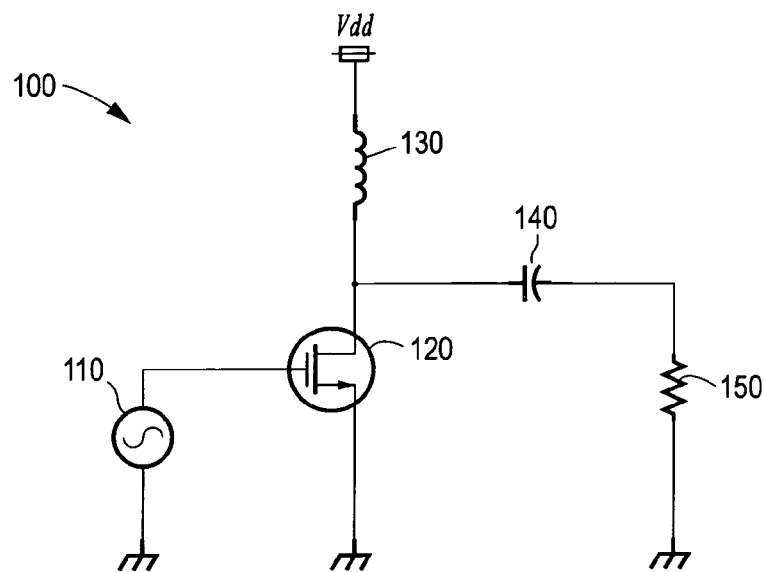
FIG. 1 is a circuit diagram of a power amplifier.

The invention will be discussed with reference to preferred embodiments of apparatuses, methods, and articles of manufacture for amplifying electromagnetic waves. Specific details are set forth in order to provide a thorough understanding of the invention. The preferred embodiments discussed herein should not be understood to limit the invention. Furthermore, for ease of understanding, certain method steps are delineated as separate steps; however, these steps should not be construed as necessarily distinct nor order dependent in their performance. Embodiments of the invention may be comprised of hardware or any combination of hardware, software and/or firmware. Accordingly, individual elements and/or combinations of elements in the drawings may be embodied in many different ways, as is well known to those of ordinary skill in the art.

It should be noted that the word "signal" is used herein to describe an electromagnetic wave that has been modulated in some fashion, usually by the impression of intelligence upon the wave, for example by imposing data upon a carrier wave. It should also be noted that the use of "signal" and "wave" in the singular includes the plural (or multiple signals and waves respectively) as often transmitters generate more than one signal and/or wave in the normal course of their operation. It should also be noted that embodiments of the invention might be used to output waves as well as signals as is further described below.

FIG. 1 illustrates a power amplifier 100. A signal from a signal source 110 is connected to a switching element 120. In one embodiment, the switching element 120 is a field effect transistor (FET), for example an nFET. In this embodiment, the signal from the signal source 110 is connected to the gate of the FET 120. A voltage source $V_{dd}$, also known as a supply voltage, is connected to the drain of the FET 120 via an RF choke inductor 130. A capacitive load 140 is also connected to the drain of the FET 120. The capacitor 140 is a coupling and/or impedance matching element. There is a resistance 150 coupled to between the capacitive load 140 and ground representing a load. The source of the FET 120 is connected to ground. When the gate-source voltage ($V_{gs}$) of the FET 120 is high, the FET 120 is in an "on" or "closed" state. In the "closed" state, current flows from the drain to the source of the FET 120. In the ideal transistor, there is no resistance so $V_{ds}$ is zero and no power is dissipated by the FET 120 and $V_{dd}$ drives the capacitive load 140. When $V_{gs}$ is low, the FET 120 is in an "off" or "open" state and current does not flow from the drain to the source of the FET 120. Of course, this is not possible in an actual device and the current flowing through the FET 120 will give rise to a drain-source voltage $V_{ds}$ that is a product of this current multiplied by the drain-source resistance of the FET 120.

Figure 2A:
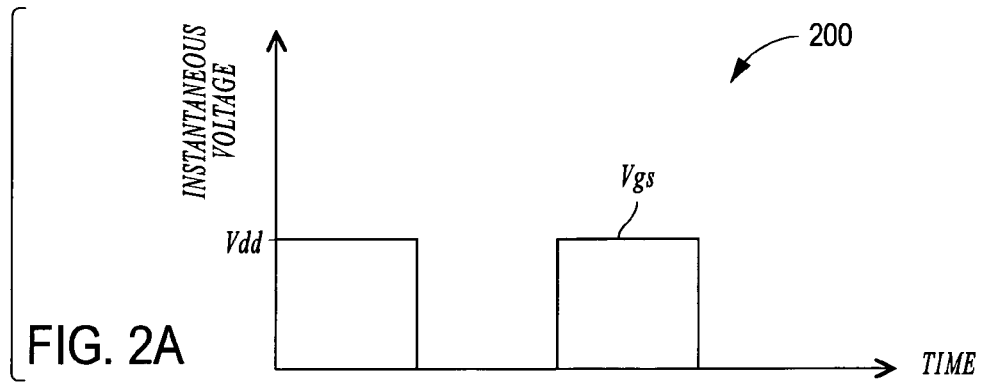
FIG. 2A is a plot of the voltage between the gate and the source of the FET of the power amplifier of FIG. 1 as a function of time.
Figure 2B:
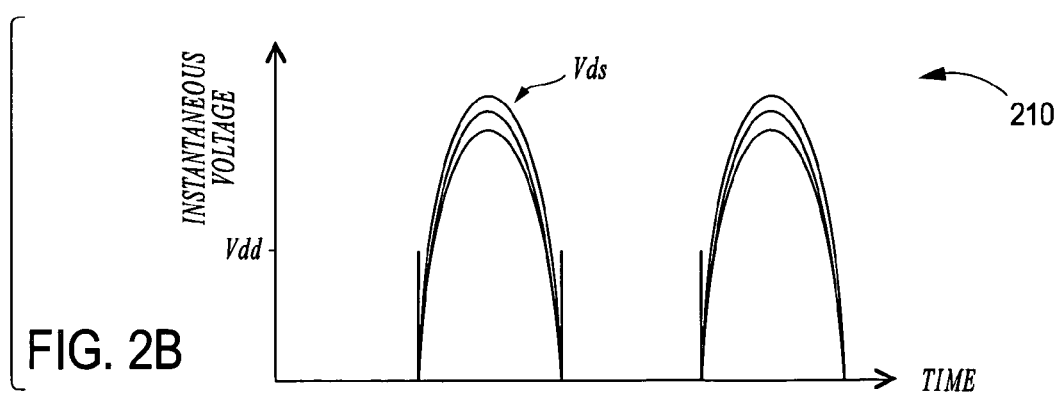
FIG. 2B is a plot of the voltage between the drain and the source of the FET of the power amplifier of FIG. 1 as a friction of time.

FIG. 2A is a plot of $V_{gs}$ 200 as a function of time for the FET 120. FIG. 2B is a plot of $V_{ds}$ 210 as a function of time for the FET 120 in an ideal scenario where there is no drain-source resistance. As illustrated by the plurality of curves, $V_{ds}$ may vary due to the operating temperature of the device or other factors, as shown. The RF choke inductor 130 causes the instantaneous $V_{ds}$ of the FET 120 to swing above $V_{dd}$ during the "off" state of the FET 120. For example, in an idealized Class E power amplifier, $V_{ds}$ will swing to $3.6 \times V_{dd}$. In an idealized Class F power amplifier, $V_{ds}$ will swing to $2 \times V_{dd}$. In either case, the abrupt swings in instantaneous voltage and the accompanying high local electric fields result in the extreme acceleration of individual carriers (i.e., holes or electrons) within the FET 120. This phenomenon is known as the "hot electron" effect. In some cases, the hot electrons will have sufficient kinetic energy to enter the gate insulator of the FET 120. Over time, as these carriers continue to compromise the insulator and accumulate therein, the performance of the FET 120, including the rated threshold voltage, drain current and/or output power, will degrade.

The above-discussed potentially detrimental voltage variations at the drain of the FET 120 may be regulated by employing first and second switching elements in series with a clamping element at the connection between the first and second switching elements. In preferred embodiments, the first and second switching elements are transistors and, in particularly preferred embodiments the first and second switching elements are field effect transistors (FETs) employed for use in sub-micron CMOS applications. The first and second switching elements and the clamping element may have identical threshold voltages.

Figure 3:
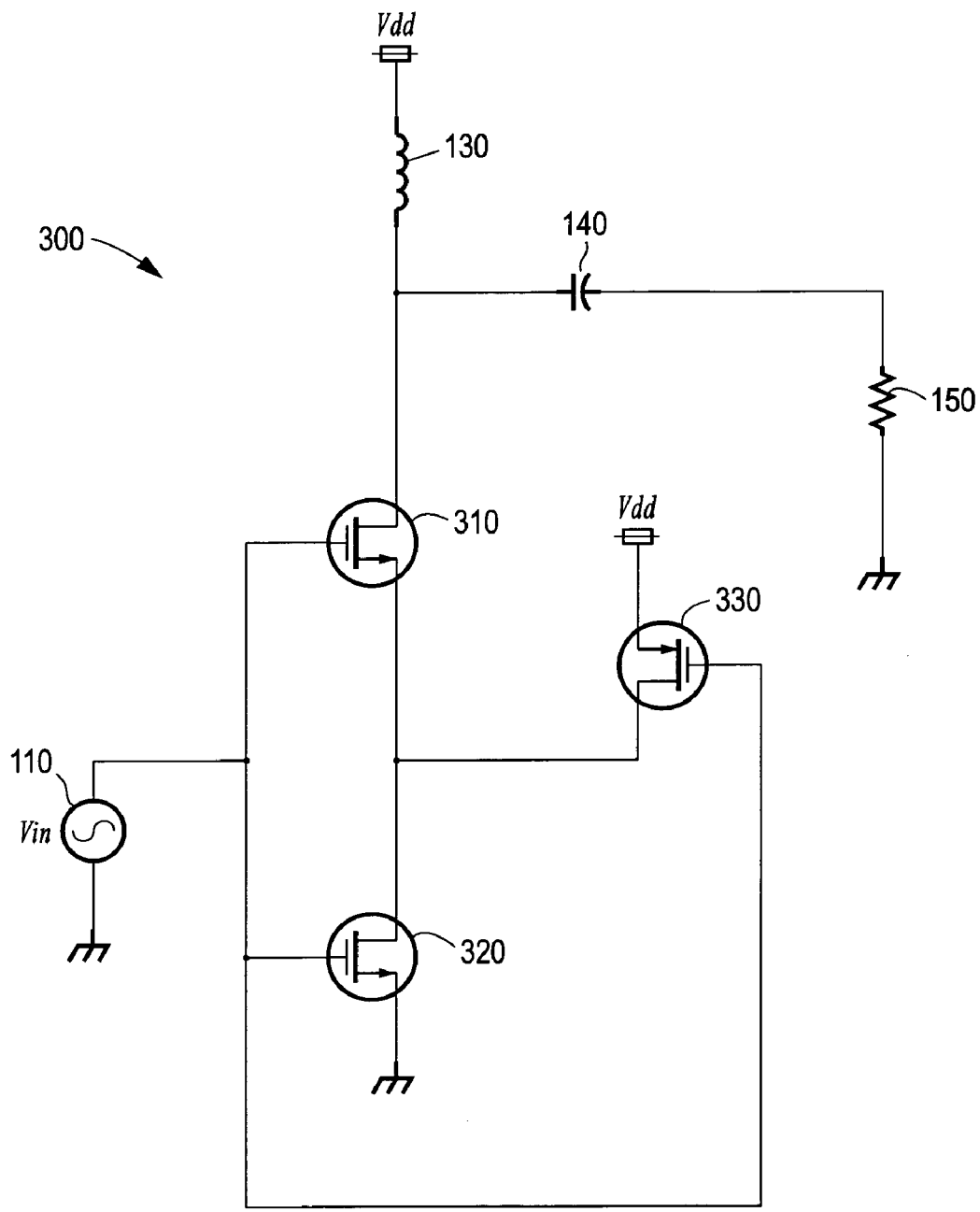
FIG. 3 is a circuit diagram of a power amplifier including a clamping element according to embodiments of the invention.

A power amplifier circuit 300 with voltage regulation in accordance with the present invention is illustrated in FIG. 3. In one example, the circuit 300 is a Class F switch-mode power amplifier. While a Class F switch-mode power amplifier is described herein to demonstrate the benefits of the circuit 300, the relative affects for other classes of switch-mode power amplifiers and/or other types of circuits should be well understood by those skilled in the art.

As mentioned above, in preferred embodiments of the invention, the first switching element 310 and second switching element 320 are field effect transistors (FETs) which may be, for example, nFETs. The circuit 300 is intended to limit drain-source voltage of the first FET 310 to the maximum instantaneous drain voltage of the first FET 310 less the supply voltage ($V_{ds,max}=V_{d1,max}-V_{dd}$). The source of the first FET 310 is connected in series to the drain of a second FET 320. The signal from a signal source such as the signal source 110 described in FIG. 1 is connected to the gate of both the first FET 310 and the second FET 320. The source of the second FET 320 is connected to ground. A terminal of an active clamp 330 is connected to a node between the source of the first FET 310 and the drain of the second FET 320. The active clamp 330 is also a switching element, for example a FET. An input terminal of the active clamp 330 is connected to the signal from the signal source 110. The active clamp will have an "on/off" state function opposite to the first and second FETs. More specifically, when the first and second FETs (310,320) are driven to the closed state by the signal source 110, the active clamp will be driven to an open state and when the first and second FETs are driven to the open state by the signal source, the active clamp will be driven to the closed state. For example, if the first and second FETs 310, 320 are nMOSFETs than the active clamp will be a pMOSFET. In a preferred embodiment, a power supply terminal of the active clamp 330 is connected to the supply voltage $V_{dd}$, however, one skilled in the art will recognize that the active clamp 330 may be connected to other voltage sources to provide voltage regulation across the first FET 310 (and the second FET 320) as desired.

Similar to FIG. 1, a voltage source $V_{dd}$, also known as a supply voltage, is connected to the drain of the first FET 310 via an RF choke inductor 130. A capacitor 140 is also connected to the drain of the FET 120. The capacitor 140 is a coupling and/or impedance matching element. There is a resistance 150 between the capacitor 140 and ground. This resistance 150 represents the "load" to which power is delivered.

When $V_{gs1}$ and $V_{gs2}$ are high, the first FET 310 and the second FET 320 are in the "closed" state. The current flow from the drain to the source of the first FET 310 is equal to $V_{dd}/2$ times the drain-source resistance of the first FET 310. Again, in the ideal condition, the drain-source resistance is zero and as such $V_{ds1}$ is equal to zero. When $V_{gs1}$ and $V_{gs2}$ are low, the first FET 310 and the second FET 320 are in the "open" state and no current flows through the drain and source of the first FET 310 to the drain and source of the second FET 320. The active clamp 330 sets the node between the source of the first FET 310 and the drain of the second FET 320 to $V_{dd}$.

Figure 4A:
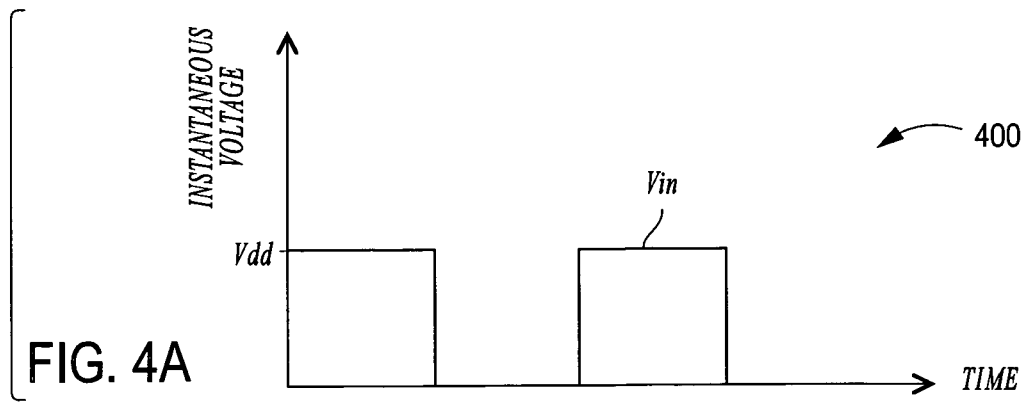
FIG. 4A is a plot of the voltage between the gate and the source of the FETs of the power amplifier of FIG. 3 as a function of time.
Figure 4B:
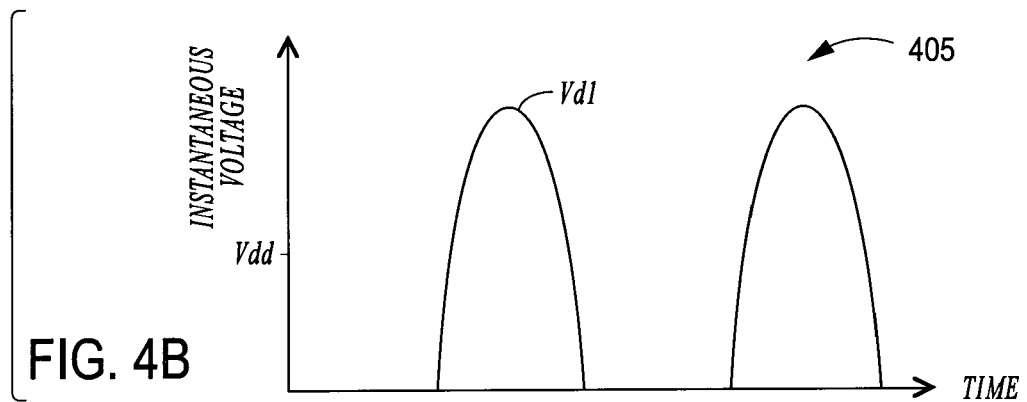
FIG. 4B is a plot of the voltage at the drain of the first FET of the power amplifier of FIG. 3 as a function of time according to embodiments of the present invention.
Figure 4C:
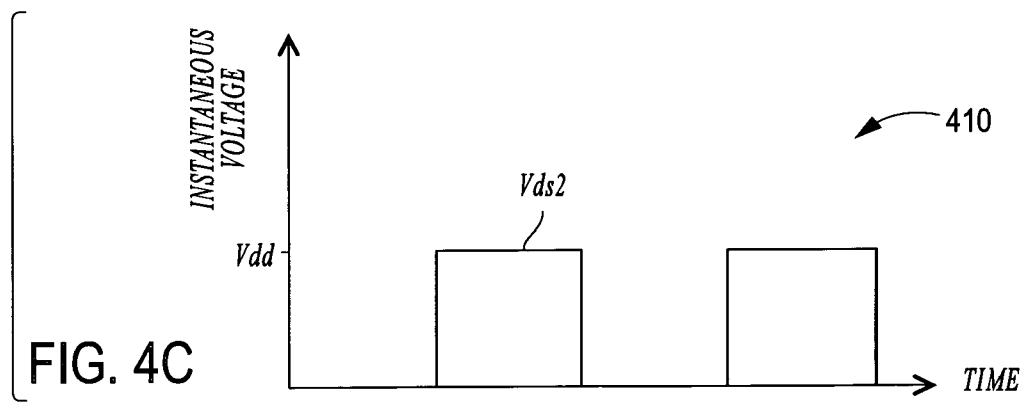
FIG. 4C is a plot of the voltage between the drain and the source of a second FET of the power amplifier of FIG. 3 as a function of time according to embodiments of the present invention.
Figure 4D:
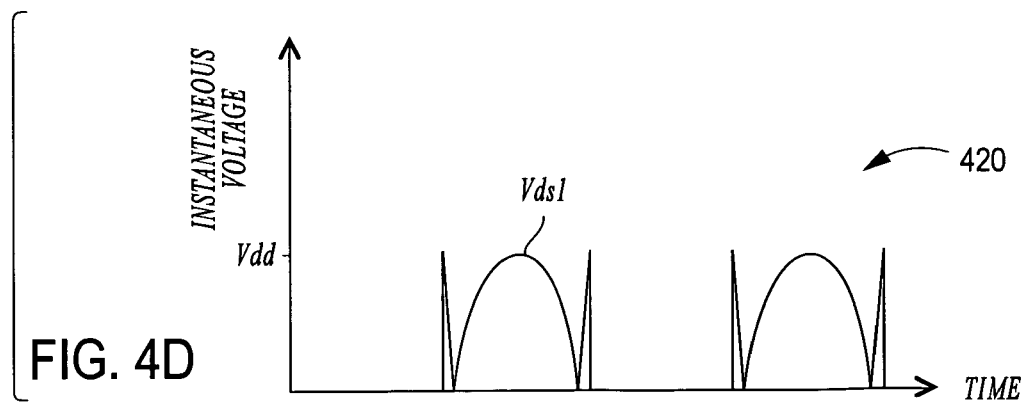
FIG. 4D is a plot of the voltage between the drain and the source of the first FET of the power amplifier of FIG. 3 as a function of time according to embodiments of the present invention.

FIGS. 4A–4D are plots 400, 405, 410 and 420 respectively, of the gate voltage $V_g(V_{in})$ of the FETs 310, 320, the drain voltage, $V_{d1}$, for the first nFET 310, $V_{ds2}$ and $V_{ds1}$ as functions of time for a switch-mode power amplifier, as illustrated in FIG. 3. FIG. 4B illustrates in plot 405 that the voltage at the drain of the first FET 310, $V_{d1}$, will be greater than $V_{dd}$ (for example, $V_{d1,max}=2V_{dd}$ in a class F power amplifier) when the FETs 310, 320 are open. FIGS. 4C and 4D illustrate in plots 410 and 420 that $V_{ds2}$ will equal $V_{dd}$ and $V_{ds1}$ will be equal to the instantaneous voltage at the drain of the first FET 310 ($V_{d1}$) less the supply voltage ($V_{dd}$), ($V_{ds1}=V_{d1}-V_{dd}$) when the FETs 310, 320 are open. For example, the maximum instantaneous voltage across the first FET 310 ($V_{ds1,max}$) for a Class F switch-mode power amplifier will be $V_{dd}$, (as $V_{d1,max}$ for a Class F switch-mode power amplifier is $2V_{dd}$), which is a reduction of 50 percent over a Class F switch-mode power amplifier circuit as in FIG. 1.

As such, the large instantaneous voltage swings across the switching transistors are regulated to minimize hot electron effects. Therefore, the transistors can be fabricated using sub-micron CMOS processes without limiting performance factors such as the drain-source voltage and drain current.

In preferred embodiments of the invention, the first FET 310 and second FET 320 are implemented as sub-micron CMOS transistors employed in, for example, a large-signal switch-mode power amplifier. However, those skilled in the art will recognize that various implementations of the first and second switching elements, 310 and 320 respectively, are possible. Moreover, it is also possible to realize the instantaneous voltage regulation circuit in different forms.

While the invention has been described by illustrative embodiments, additional advantages and modifications will occur to those skilled in the art. Therefore, the invention in its broader aspects is not limited to the specific details shown and described above. Modifications may be made without departing from the scope and spirit of the invention. Accordingly, it is intended that the invention not be limited to the specific illustrative embodiments, but be interpreted within the full spirit and scope of the appended claims and their equivalents.

What is claimed is:

1. A method of limiting instantaneous voltages in a power amplifier comprising the steps of:
    providing a power amplifier, the power amplifier including first and second series coupled switching elements each with a closed state and an open state;
    setting a connection between said first and second switching elements to a reference voltage when said first and second switching elements are in the open state; and
    providing a regulated flow of current to a drain of said first switching element via circuitry including an inductor and a capacitor.

2. The method of claim 1, wherein the setting step is accomplished using a third switching element.

3. The method of claim 2, wherein the third switching element has a state function opposite to the first and second switching elements.

4. The method of claim 3, further comprising clamping the connection between said first and second switching elements for regulating the drain-source voltages of said first and second switching elements.

5. The method of claim 3, further comprising clamping the connection between said first and second switching elements for limiting the drain voltage of said second switching element to the reference voltage.

6. The method of claim 3, wherein first and second switching elements are field effect transistors (FETs).

7. The method of claim 3, wherein said first and second switching elements are fabricated using a CMOS process.

8. The method of claim 1, wherein said reference voltage is equal in magnitude to a supply voltage for the power amplifier.

9. The method of claim 1, wherein a clamping element is operable to set a connection between said first and second switching elements to a reference voltage when said first and second switching elements are in the open state.

10. A power amplifier comprising:
    first and second switching elements, each having an open state and a closed state, wherein said first and second switching elements are connected in series;
    a clamping element operable to set a node between said first and second switching elements to a reference voltage when said first and second switching element are in the open state; and
    circuitry including an inductor and capacitor coupled to a drain of said first switching element for regulating the flow of current to the drain of said first switching element.

11. The power amplifier of claim 10, wherein said first and second switching elements are first and second transistors.

12. The power amplifier of claim 11, wherein the source of said first transistor is connected to the drain of said second transistor.

13. The power amplifier of claim 10, wherein said clamping element regulates the drain-source voltages of said first and second switching elements.

14. The power amplifier of claim 10, wherein said clamping element limits the drain voltage of said second switching element to the reference voltage.

15. The power amplifier of claim 10, wherein the first and second switching elements are field effect transistors (FETs).

16. The power amplifier of claim 11, wherein said first and second transistors are fabricated using a CMOS process.

17. The power amplifier of claim 10, wherein said reference voltage is equal in magnitude to a supply voltage of the power amplifier.

18. The power amplifier of claim 10, wherein said clamping element is an active clamp.

* * * * *